(12) United States Patent
Nakashima

(10) Patent No.: US 8,094,224 B2
(45) Date of Patent: Jan. 10, 2012

(54) SOLID-STATE IMAGE CAPTURING APPARATUS

(75) Inventor: Yoshimitsu Nakashima, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 694 days.

(21) Appl. No.: 12/215,561

(22) Filed: Jun. 27, 2008

(65) Prior Publication Data

US 2009/0027528 A1    Jan. 29, 2009

(30) Foreign Application Priority Data

Jun. 28, 2007  (JP) .................. 2007-170726

(51) Int. Cl.
*H04N 3/14* (2006.01)
*H04N 5/335* (2011.01)
*H01L 27/00* (2006.01)
*H01L 27/148* (2006.01)

(52) U.S. Cl. .............. 348/300; 348/317; 250/208.1; 257/233

(58) Field of Classification Search ............ 348/300, 348/315, 317–323; 257/232, 233, 422; 250/208.1, 250/214.1, 216, 239

See application file for complete search history.

(56) References Cited

U.S. PATENT DOCUMENTS

| 6,388,278 | B1 * | 5/2002 | Suzuki et al. | 257/222 |
| 6,606,124 | B1 * | 8/2003 | Hatano et al. | 348/311 |

FOREIGN PATENT DOCUMENTS

| JP | 62-155560 | 7/1987 |
| JP | 05-344425 | 12/1993 |
| JP | 2001-168315 | 6/2001 |
| JP | 2002-231927 | 8/2002 |
| JP | 2004-253740 | 9/2004 |

* cited by examiner

*Primary Examiner* — Kelly L Jerabek
(74) *Attorney, Agent, or Firm* — Edwards Wildman Palmer LLP; David G. Conlin; Stephen D. LeBarron

(57) ABSTRACT

A solid-state image capturing apparatus has a plurality of light receiving sections for performing photoelectric conversion on incident light to generate a signal charge, a charge transfer section provided along a light receiving section arranged in a column direction among the plurality of light receiving sections, for transferring signal charges generated in the light receiving section arranged in the column direction to a predetermined direction, and at least two layers of charge transfer electrodes provided on the charge transfer section via an insulation film, where a plane view width readable from the light receiving section is 50% to the whole edge of the edge of the light receiving section on the charge transfer section side.

39 Claims, 9 Drawing Sheets

PRIOR ART

PRIOR ART

SOLID-STATE IMAGE CAPTURING APPARATUS

This Nonprovisional application claims priority under 35 U.S.C. §119(a) on Patent Application No. 2007-170726 filed in Japan on Jun. 28, 2007, the entire contents of which are hereby incorporated by reference.

BACKGROUND OF THE INVENTION

1. Field of the Invention

The present invention relates to a solid-state image capturing apparatus having semiconductor devices for performing photoelectric conversion on image light from a subject to capture the same, and more particularly, to a solid-state image capturing apparatus suitable for minimizing a cell size, and an electronic information device, such as a digital camera (e.g., digital video camera and digital still camera), an image input camera, a scanner, a facsimile machine and a camera-equipped cell phone device, having the solid-state image capturing apparatus as an image input device in an image capturing section of the electronic information device.

2. Description of the Related Art

In recent years, solid-state image capturing apparatuses used for digital still cameras, digital video cameras and the like steadily continue to be reduced in size and to have a higher pixel density. With respect to CCD solid-state image capturing apparatus, which is one type of the solid-state image capturing apparatuses, because of the reducing of size and the increasing of pixel density of the image capturing apparatus, its cell size has been minimized, and in addition, the cell size of a light receiving section and a vertical charge transfer register has been further minimized. Such a reduction in size leads to a decrease in light receiving sensitivity, a decrease in the capacity to store electric charges in a light receiving section, and a decrease in the capacity to store vertical charge transfer in a vertical charge transfer register. Therefore it is becoming difficult to achieve further minimization.

Herein, the structure of a conventional solid-state image capturing apparatus will be described in detail with reference to FIG. 9.

FIG. 9 is a block diagram schematically showing an exemplary diagrammatic structure of a conventional solid-state image capturing apparatus.

In FIG. 9, the structure of a conventional solid-state image capturing apparatus 100 is divided into an image capturing section 101 provided with a plurality of pixel sections, a horizontal charge transfer register 102 for transferring signal charges from the image capturing section 101 in a horizontal direction, and a signal output section 103 functioning as an electric charge detection section for detecting the transferred signal charges to output them as image capturing signals.

In the image capturing section 101, a plurality of light receiving sections 104, which is formed of a plurality of pixel sections for performing photoelectric conversion and storing generated signal charges, are arranged in a matrix in row and column directions (vertical and horizontal directions). Along each column of the respective light receiving sections 104, a vertical charge transfer register 105 is provided to transfer signal charges in a vertical direction.

According to the structure described above, first, image light from a subject enters the plurality of light receiving sections 104. Each of the light receiving sections 104 performs photoelectric conversion on the incident light to generate signal charges, and the signal charges are stored. Next, the signal charges in each pixel column are transferred in a vertical direction by each vertical charge transfer register 105. The transferred electric charges in each pixel row are transferred in a horizontal direction to the signal output section 103 by the horizontal charge transfer register 102. Further, the transferred signal charges are detected by the signal output section 103 and are outputted as image capturing signals.

The structure of a vertical charge transfer electrode in the conventional solid-state image capturing apparatus will be described in detail with reference to FIG. 10.

FIG. 10 is a top view showing an exemplary essential structure of an image capturing section in the solid-state image capturing apparatus 100 in FIG. 9.

In FIG. 10, the vertical charge transfer register 105 in the conventional solid-state image capturing apparatus 100 is provided in between light receiving sections 104 in a column direction, and a first layer of a vertical transfer electrode 106 and a second layer of a vertical transfer electrode 107, which are composed of a polysilicon film and are respectively interposed by a insulation film, are successively arranged on the vertical charge transfer register 105. The two types of the vertical transfer electrodes 106 and 107 are alternatively arranged on the vertical charge transfer register 105 in a charge transfer direction, and the vertical transfer electrode 107 is provided for each light receiving section 104 in an adjacent manner. The second layer of the vertical charge transfer register 107 is arranged in a corresponding manner to the vertical width of the light receiving section 104. The vertical transfer electrode 107 also serves as a readout electrode for reading signal charges from the light receiving section 104 to the vertical charge transfer register 105.

With the structure described above, the conventional solid-state image capturing apparatus 100 operates as follows.

First, image light from a subject enters each of the light receiving sections 104 and the incident light is photoelectrically converted into signal charges. The signal charges are once stored in each of the light receiving sections 104, the light receiving sections forming respective pixel sections.

Next, the signal charges stored in the respective light receiving sections 104 are read out to the sides of the respective vertical charge transfer registers 105 in each pixel column by the respective readout electrodes 107.

Further, the signal charges, which are read out by the respective vertical charge transfer registers 105 in each column, are transferred to the horizontal charge transfer registers 102 side by one horizontal line at a time in a vertical direction in the respective pixel sections corresponding to a display screen.

The signal charges in each pixel row (one horizontal line), which are transferred to the horizontal charge transfer register 102, are transferred in a horizontal direction to the signal output section 103 and are detected in the signal output section 103 to be outputted as image capturing signals for respective pixels.

As described above, it is necessary to reduce the size of the conventional solid-state image capturing apparatus 100 as much as possible in order to obtain a small and high pixel density conventional solid-state image capturing apparatus 100. In order to reduce the size and increase the pixel density, it is necessary to minimize the cell size of the image capturing apparatus. Thus, it is necessary to minimize the light receiving section and the vertical charge transfer register themselves in order to minimize the cell size. However, openings (openings above the light receiving section 104) of a shading film covering the vertical transfer electrode becomes narrow if the cell size is minimized, causing the decrease in light receiving sensitivity and the decrease in dynamic range.

As shown in FIG. 11, Reference 1 discloses a solid-state image capturing apparatus 110, in which light receiving sections 104a and 104b are arranged on either side of a vertical charge transfer register 105 and the light receiving sections 104a and 104b are repeatedly arranged in parallel to each other. The light receiving section 104a arranged on the right side of the vertical transfer register 105 and the light receiving section 104b arranged on the left side of another vertical transfer register 105 adjacent to the right of the aforesaid vertical transfer register 105 are separated by a separation area (channel stop area) 108. Due to the pixel separation structure, it is feasible to minimize the area of the vertical charge transfer register 105 and increase the area of the light receiving section 104, thereby preventing the light receiving sensitivity and the dynamic range from decreasing.

As shown in FIG. 12, Reference 2 discloses a solid-state image capturing apparatus 120, in which light receiving sections 104a and 104b are arranged on both of the left and right sides of a vertical transfer register 105 and the positions of the light receiving sections 104a and 104b are shifted from each other in a vertical transfer direction. In this case, the light receiving section 104a on one side generates signal charges to be outputted during a first field period, and the light receiving section 104b on the other side generates signal charges to be outputted during a second field period. Due to this structure, the resolution can be improved by increasing the number of the light receiving sections 104a and 104b in a specific direction such as a vertical direction.

Reference 1: Japanese Laid-Open Publication No. 5-344425

Reference 2: Japanese Laid-Open Publication No. 62-155560

SUMMARY OF THE INVENTION

The conventional solid-state image capturing apparatus described above has the following problems.

As described above, the reducing in size and providing higher pixel density are strongly desired for the conventional solid-state image capturing apparatus 100, and the cell size of the solid-state image capturing apparatus 100 needs to be reduced by minimizing the light receiving section 104 and the vertical charge transfer register 105. However, openings (openings above the light receiving section 104) of a shading film covering the vertical transfer electrode becomes narrow if the cell size is minimized, causing the decrease in light receiving sensitivity and the decrease in dynamic range.

It is said for the solid-state image capturing apparatus 110 that the light receiving sections 104a and 104b are arranged on either side of a vertical charge transfer register 105 and the light receiving sections 104a and 104b are repeatedly arranged in parallel to each other so that it is feasible to minimize the area of the vertical charge transfer register 105 and increase the area of the respective light receiving sections 104a and 104b, thereby preventing the light receiving sensitivity of the respective light receiving sections 104 and the dynamic range from decreasing.

However, according to the conventional solid-state image capturing apparatus 110 disclosed in Reference 1 as shown in FIG. 11, the readout electrodes can be arranged only up to the upper half of the readout portion of each light receiving section 104b and up to the lower half of the readout portion of each light receiving section 104a. Therefore, the structure according to Reference 1, in which the readout electrodes can be arranged only up to either the upper half or the lower half of the readout portion of each light receiving section 104, may cause to increase readout voltage, compared with the conventional solid-state image capturing apparatus 100 shown in FIG. 10, in which the readout electrode (second layer of the vertical charge transfer electrode 107) is arranged in contact with the overall readout portion. This problem also applies to the conventional solid-state image capturing apparatus 120 disclosed in Reference 2.

The present invention is intended to solve the conventional problems described above. The objective of the present invention is to provide a solid-state image capturing apparatus, in which the light receiving sensitivity and the dynamic range are prevented from decreasing without increasing the readout voltage and the cell size cab be minimized, and to provide an electronic information device using the solid-state image capturing apparatus as an image input device in an image capturing section.

A solid-state image capturing apparatus according to the present invention has, on a semiconductor substrate, a plurality of light receiving sections for performing photoelectric conversion on incident light to generate a signal charge, a charge transfer section provided along a light receiving section arranged in a column direction among the plurality of light receiving sections, for transferring signal charges generated in the light receiving section arranged in the column direction to a predetermined direction, and at least two layers of charge transfer electrodes provided on the charge transfer section via an insulation film, in which the light receiving sections are respectively arranged on both of the left and right sides of the charge transfer section, in which a plane view width readable from the light receiving section is 50% to the whole edge of the edge of the light receiving section on the charge transfer section side, thereby achieving the objective described above.

A solid-state image capturing apparatus according to the present invention has, on a semiconductor substrate, a plurality of light receiving sections for performing photoelectric conversion on incident light to generate a signal charge, a charge transfer section provided along a light receiving section arranged in a column direction among the plurality of light receiving sections, for transferring signal charges generated in the light receiving section arranged in the column direction to a predetermined direction, and at least two layers of charge transfer electrodes provided on the charge transfer section via an insulation film, in which the light receiving sections are respectively arranged on both of the left and right sides of the charge transfer section, in which crossing lengths of the predetermined direction of the charge transfer electrode are different on the left end and the right end above the charge transfer section, thereby achieving the objective described above.

Still preferably, in a solid-state image capturing apparatus according to the present invention, the plane view width readable from the light receiving section is a crossing length of the light receiving section and the readout electrode and is 50% to the whole edge of the edge of the light receiving section on the charge transfer section side.

Still preferably, in a solid-state image capturing apparatus according to the present invention, the light receiving section on one side of the charge transfer section and the light receiving section on the other side are shifted from each other along the predetermined direction and arranged.

Still preferably, in a solid-state image capturing apparatus according to the present invention, a first layer of the charge transfer electrode also serves as a readout electrode to read out signal charges from the light receiving section arranged on one side of the charge transfer section to the charge transfer section, and a second layer of the charge transfer electrode also serves as a readout electrode to read out signal charges from the light receiving section arranged on the other side of the charge transfer section to the charge transfer section.

Still preferably, in a solid-state image capturing apparatus according to the present invention, in the left end and the right end above the charge transfer section, the crossing length of the charge transfer electrode on the light receiving section side, from which signal charges are read out, is formed longer in the predetermined direction than the crossing length on the opposite side.

Still preferably, in a solid-state image capturing apparatus according to the present invention, the crossing length becomes smoothly longer or becomes longer stepwise from one end to another end between the left end and the right end of the charge transfer section.

Still preferably, in a solid-state image capturing apparatus according to the present invention, in the left end and the right end above the charge transfer section, the crossing length of the charge transfer electrode on the opposite side from the light receiving section side, from which signal charges are read out, is formed shorter in the predetermined direction than the crossing length on the light receiving section side.

Still preferably, in a solid-state image capturing apparatus according to the present invention, the crossing length becomes smoothly shorter or becomes shorter stepwise from one end to another end between the left end and the right end of the charge transfer section.

Still preferably, in a solid-state image capturing apparatus according to the present invention, on the charge transfer section, an overlapping area of the charge transfer electrode is either smoothly extended or is extended stepwise in a plane view as the area becomes closer to the side of the light receiving section, from which signal charges are read out.

Still preferably, in a solid-state image capturing apparatus according to the present invention, on the charge transfer section, an overlapping area of the charge transfer electrode is either smoothly narrowed or is narrowed stepwise in a plane view as the area becomes closer to the opposite side of the side of the light receiving section, from which signal charges are read out.

Still preferably, in a solid-state image capturing apparatus according to the present invention, the second layer of the charge transfer electrode and the first layer of the charge transfer electrode are partially overlapping on the charge transfer section.

Still preferably, in a solid-state image capturing apparatus according to the present invention, a separation area for separating the plurality of light receiving sections is further provided between adjacent light receiving sections.

Still preferably, in a solid-state image capturing apparatus according to the present invention, the second layer of the charge transfer electrode and the first layer of the charge transfer electrode are either partially overlapping with each other or not overlapping at all with each other on at least a part of the separation area.

Still preferably, in a solid-state image capturing apparatus according to the present invention, boron is implanted into the separation area with impurity concentration of the range of $1 \times 10^{16}$ cm$^{-3}$ to $1 \times 10^{17}$ cm$^{-3}$.

Still preferably, in a solid-state image capturing apparatus according to the present invention, a shading film is provided so that at least the charge transfer electrode is covered, with an opening provided above the light receiving section.

Still preferably, in a solid-state image capturing apparatus according to the present invention, a separation area is further provided to separate the plurality of light receiving section, and with regard to the separation area, a shading film is provided in such a manner to open above a horizontal separation area that separates the plurality of light receiving sections in a horizontal direction, or a shading film covers the whole image capturing section except for the opening above the light receiving sections, or a shading film is provided in such a manner to open above a horizontal separation area and above a vertical separation area that separates the plurality of light receiving sections in a vertical direction.

Still preferably, in a solid-state image capturing apparatus according to the present invention, the charge transfer section is formed of a vertical charge transfer register.

Still preferably, a solid-state image capturing apparatus according to the present invention further includes a horizontal charge transfer register for transferring a signal charge of each pixel row in a horizontal direction, the signal charge of each pixel row being transferred in a vertical direction by the vertical charge transfer register, and a signal output section for successively detecting the signal charge transferred by the horizontal charge transfer register to output the signal charge as an image capturing signal.

Still preferably, in a solid-state image capturing apparatus according to the present invention, the light receiving section is a square or a rectangle in a plane view.

An electric information device according to the present invention includes the solid-state image capturing device according to the present invention as an image input device in an image capturing section, thereby achieving the objective described above.

The functions of the present invention having the structures explained above will be described hereinafter.

According to the present invention, light receiving sections are arranged on both of the left and right sides of a vertical charge transfer register, which functions as a charge transfer section. Therefore, it is feasible to minimize the area of the vertical charge transfer register, and further it is feasible to increase the area of the light receiving section. Thereby it is feasible to minimize the cell size without decreasing the light receiving sensitivity.

Light receiving sections are arranged on the left and right sides of the vertical charge transfer register, which functions as a charge transfer section, and the positions of the respective light receiving sections are shifted from each other in a vertical direction and arranged, the vertical direction being a predetermined direction. A first layer of the vertical transfer electrode, which functions as a charge transfer electrode, is also used as a readout electrode of the light receiving section arranged on one side of the vertical charge transfer register. A second layer of the vertical transfer electrode, which functions as a charge transfer electrode, is also used as a readout electrode of the light receiving section arranged on the other side of the vertical charge transfer register. Each of the vertical transfer electrodes has different lengths in a vertical direction, which is a predetermined direction, on the left and right sides of the vertical charge transfer register, and the area in a plane view becomes wider towards the light receiving section side, where reading out of signal charges is performed. The crossing length (crossing length of the charge transfer section and the charge transfer electrode) is formed longer in a vertical direction when comparing with the opposite side. Thereby, the readout electrode can be arranged in the entire readout portion of the light receiving section (the entire side of the light receiving section) so that the readout electrode is operable in the entire readout portion, and it is feasible to control the readout voltage, which is conventionally increased. In addition, because the opposite side of the light receiving section is formed shorter in a vertical direction, the peripheral light receiving sections other than the light receiving sections whose signal charges are read out will not be affected by cross talk and the like.

According to the present invention with the structure described above, the solid-state image capturing apparatus includes light receiving sections. The light receiving sections are arranged on both of the left and right sides of the vertical charge transfer registers functioning as a charge transfer section and, for example, the positions of the light receiving sections are shifted from each other in a vertical direction and arranged. In the solid-state image capturing apparatus, the area (overlapping portion) of the charge transfer electrode (vertical transfer electrode) on the vertical charge transfer register is extended as the area of the charge transfer electrode on the vertical charge transfer register becomes closer to the light receiving section side, so that the readout electrode is arrangeable on the whole readout portion of the light receiving section. As a result, it is feasible to minimize the area of the vertical charge transfer register without increasing the readout voltage and to increase the area of the light receiving section. Thereby, it is feasible to manufacture the solid-state image capturing apparatus whose light receiving sensitivity and the dynamic range are prevented from decreasing without increasing the readout voltage and whose cell size is minimized.

These and other advantages of the present invention will become apparent to those skilled in the art upon reading and understanding the following detailed description with reference to the accompanying figures.

Figure 1:
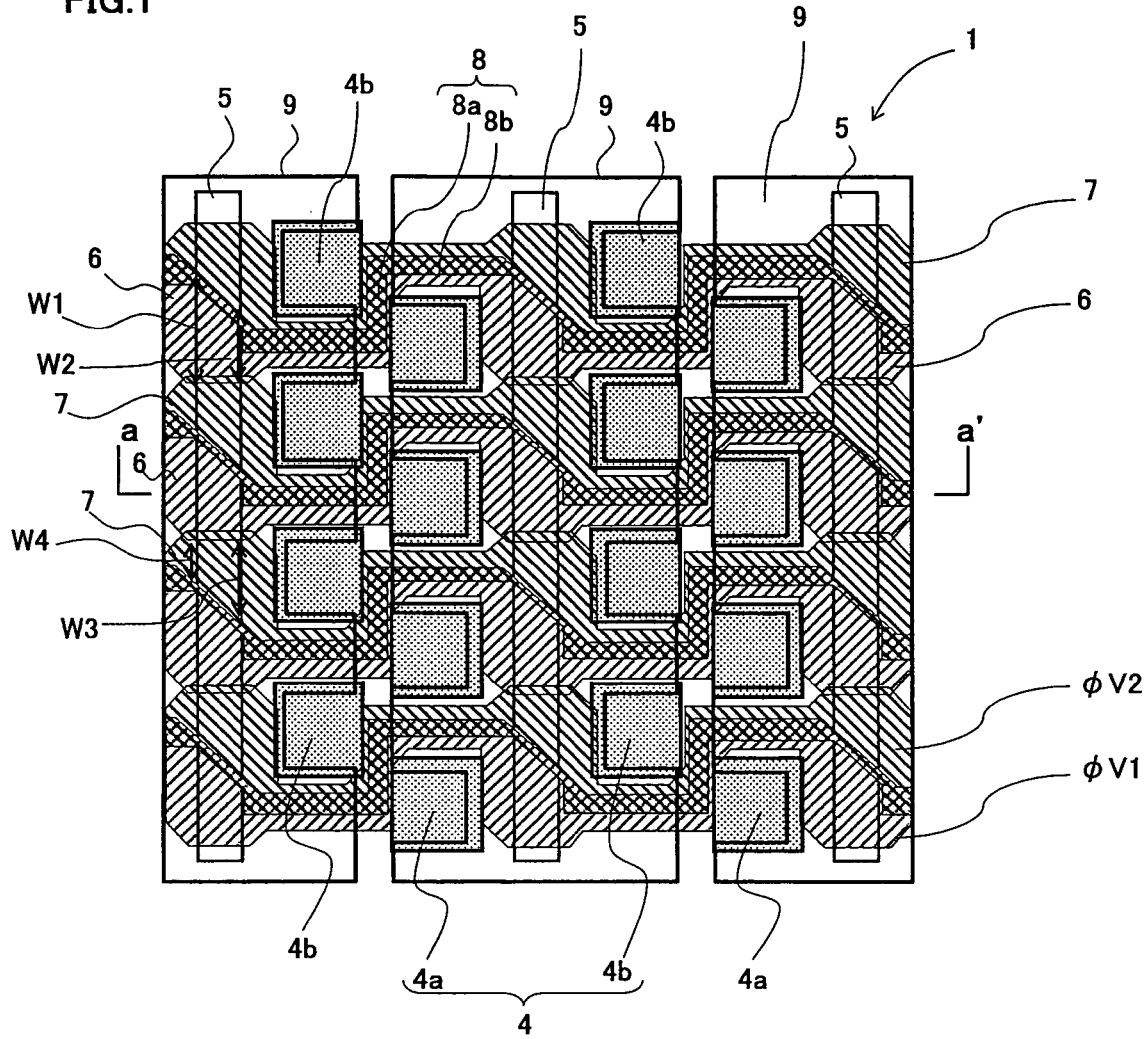
FIG. 1 is a top view showing an, exemplary essential structure of an image capturing section in the solid-state image capturing apparatus according to the embodiment of the present invention.

1, 1A to 1E image capturing section of a solid-state image capturing apparatus
4, 4a, 4b light receiving section
5 vertical charge transfer register
6 first layer of vertical transfer electrode
7 second layer of vertical transfer electrode
8 separation area
8a horizontal separation area
8b vertical separation area
9, 9D, 9E shading film
9a opening
102 horizontal charge transfer register
103 signal output section
W1, W3 width on light receiving section side
W2, W4 width on opposite side from light receiving section side
A stepwise portion
B1, C1 overlapping portion
B2 partially overlapping portion
C2 adjacent portion
10 solid-state image capturing apparatus
20 electronic information device
21 memory section
22 display section
23 communication section
24 image output apparatus

DESCRIPTION OF THE PREFERRED EMBODIMENTS

Hereinafter, an embodiment of a solid-state image capturing apparatus according to the present invention will be described with reference to figures. Note that the solid-state image capturing apparatus according to the embodiment has am image capturing section 101, a horizontal charge transfer register section 102 and an output section 103 (electric charge detection section), similar to the conventional solid-state image capturing apparatus 100 shown in FIG. 8, and the overall structures of these sections are the same as the conventional structures.

Figure 2:
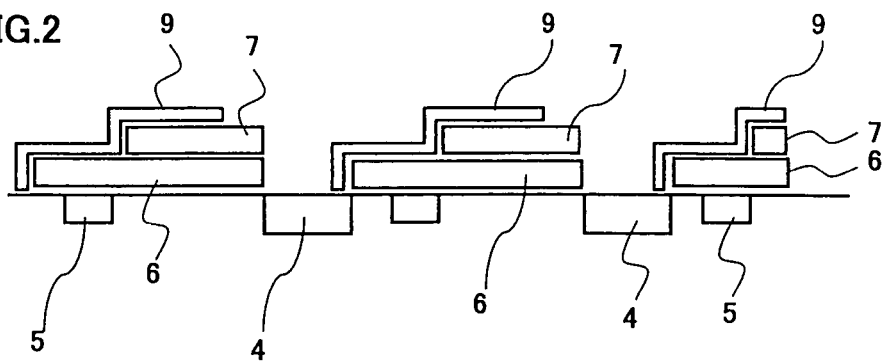
FIG. 2 is a longitudinal cross sectional view along the line a-a' in FIG. 1.

FIG. 1 is a top view showing an exemplary essential structure of an image capturing section in the solid-state image capturing apparatus according to the embodiment of the present invention. FIG. 2 is a longitudinal cross sectional view along the line a-a' in FIG. 1.

As shown in FIG. 1, on a semiconductor substrate, an image capturing section 1 of the solid-state image capturing apparatus according to the embodiment of the present invention includes: a plurality of light receiving sections 4 (photoelectric conversion elements; photodiodes) for performing photoelectric conversion on incident light (image light) from a subject to generate a signal charge, a horizontal separation area 8a for separating the light receiving sections 4 in a horizontal direction, a vertical separation area 8b for separating the light receiving sections 4 in a vertical direction, and a vertical charge transfer register 5 provided along a column direction of the light receiving sections 4, for transferring signal charges generated in the light receiving sections 4 in a vertical direction. In this case, the light receiving sections 4 are successively arranged on both of the left and right sides of the vertical charge transfer register 5 in such a manner that the positions of the light receiving sections 4 are shifted from each other along a vertical direction (column direction) of a charge transfer direction.

As shown in FIG. 2, on the vertical transfer register 5, a first layer of a vertical transfer electrode 6 and a second layer of a vertical transfer electrode 7 are arranged, which are composed of a polysilicon film and are respectively interposed by a insulation film. As shown in FIG. 1, the two layers of the vertical transfer electrodes 6 and 7 are arranged on the vertical charge transfer register 5 along a vertical direction (column direction) of a charge transfer direction, and the vertical transfer electrodes 6 and 7 are provided for each light receiving section 4. The first layer of the vertical transfer electrode 6 serves as a readout electrode to read signal charges from a light receiving section 4a arranged on one side of the vertical charge transfer register 5 (e.g., the left side) to the vertical charge transfer register 5. The second layer of the vertical transfer electrode 7 also serves as a readout electrode to read signal charges from a light receiving section 4b arranged on the other side of the vertical charge transfer register 5 (e.g., the right side) to the vertical charge transfer register 5.

The characteristic structure of the embodiment can be found in the formation of the two layers of the vertical transfer electrodes 6 and 7 in a plane view. Each of the two layers of the vertical transfer electrodes 6 and 7 arranged on the vertical charge transfer register 5 is formed in such a manner that each of them has a different length in a vertical direction at the left end and the right end of the vertical charge transfer register 5 where the vertical charge register 5 is overlapping with the vertical transfer electrodes 6 and 7. In the case of FIG. 1, on vertical charge transfer register 5, the respective widths of the vertical transfer electrodes 6 and 7 are smoothly extended in a vertical direction as the width of the vertical transfer electrodes 6 and 7 become closer to the side of the light receiving section 4, from which signal charges are readout. More specifically, with regard to the vertical transfer electrode 6 overlapping at the left and right ends of the vertical charge transfer register 5, a width W1 at the left end of the vertical charge transfer register 5 on the light receiving section 4a side (width of the vertical transfer electrode 6 on the light receiving section side) is longer than a width W2 at the right end of the vertical charge transfer register 5 on the opposite side from the light receiving section 4a side (width of the vertical transfer electrode 6 on the opposite side from the light receiving section side). Further, with regard to the vertical transfer electrode 7 overlapping at the left and right ends of the vertical charge transfer register 5, a width W3 at the right end of the vertical charge transfer register 5 on the light receiving section 4b side (width of the vertical transfer electrode 7 on the light receiving section side) is longer than a width W4 at the left end of the vertical charge transfer register 5 on the opposite side from the light receiving section 4b side (width of the vertical transfer electrode 7 on the opposite side from the light receiving section side). As a result, it is feasible to arrange the readout electrodes 6 and 7 on the whole length or almost the whole length of the readout portion of the light receiving sections 4 and to prevent the readout voltage from increasing when comparing with the conventional case where the readout electrode is arranged on about half of the readout portion of the light receiving section.

Further, on vertical charge transfer register 5, the vertical charge transfer electrodes 6 and 7 are smoothly narrowed in a plane view towards the opposite side of the light receiving section 4 side, from which signal charges are readout. More specifically, with regard to the vertical transfer electrode 6 overlapping at the left and right ends of the vertical charge transfer register 5, the width W2 on the opposite side from the light receiving section 4a side is shorter than the width W1 on the light receiving section 4a side. Further, with regard to the vertical transfer electrode 7 overlapping at the left and right ends of the vertical charge transfer register 5, the width W4 on the opposite side from the light receiving section 4b side is shorter than the width W3 on the light receiving section side. As a result, the peripheral light receiving sections 4 other than the light receiving sections 4 from which signal charges are read out will not be affected by cross talk and the like.

As shown in FIG. 2, a shading film 9 is provided via an insulation film on the vertical transfer electrodes 6 and 7 described above. The shading film 9 is provided to cover the vertical transfer electrodes 6 and 7 and to open above the light receiving section 4 with an opening 9a. According to the embodiment of the present invention, the shading film 9 is not provided above the horizontal separation area 8a, which separates the light receiving sections 4 in a horizontal direction. This is because the photoelectric conversion is even performed on the incident light that enters into the horizontal separation area 8a in order to make a contribution to the light receiving sensitivity. As a result, it is feasible to increase the light receiving sensitivity.

Further, according to the embodiment of the present invention, there is a possibility that readout voltage Vh may be applied to the separation areas 8a and 8b, which separate the light receiving sections 4 into elements, and signal charges stored in the light receiving sections 4 are mixed. Therefore, high-concentration boron is implanted into the separation areas 8a and 8b. For example, the impurity concentration of boron (B) is set within the range of $1 \times 10^{16}$ cm$^{-3}$ to $1 \times 10^{17}$ cm$^{-3}$.

With the structure described above, the operation for reading signal charges in the solid-state image capturing apparatus according to the embodiment of the present invention will be described hereinafter.

Figure 9:
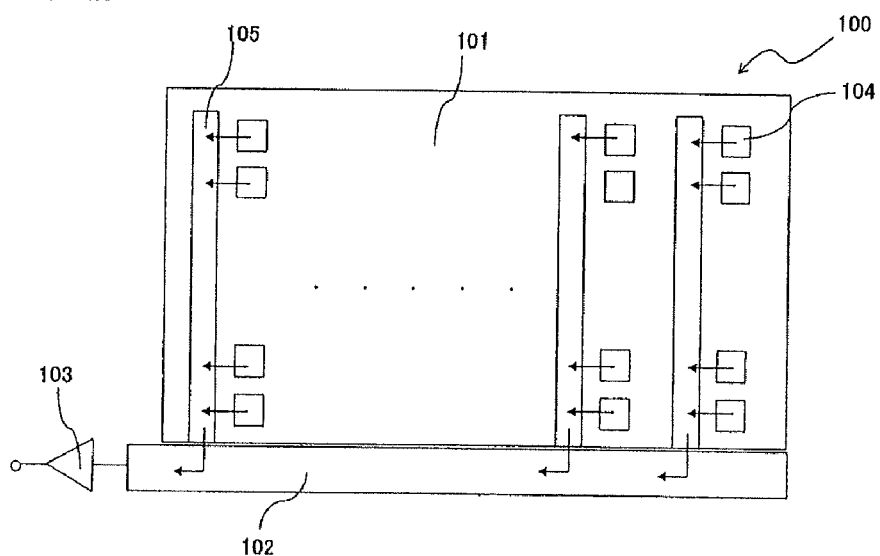
FIG. 9 is a block diagram schematically showing an exemplary diagrammatic structure of a conventional solid-state image capturing apparatus.
Figure 10:
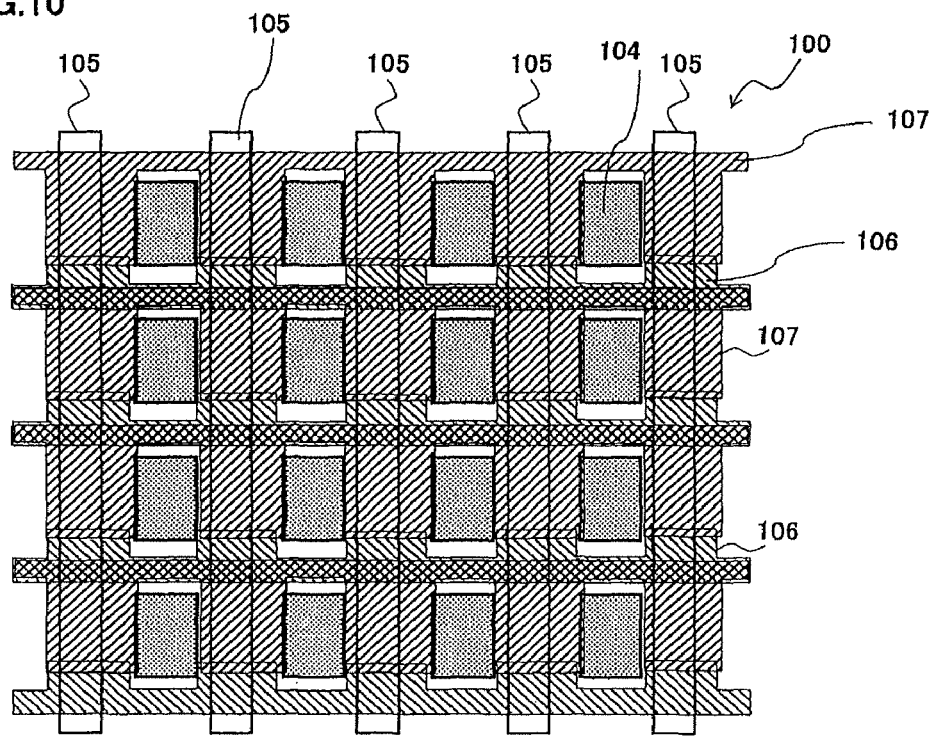
FIG. 10 is a top view showing an exemplary essential structure of an image capturing section of a conventional solid-state image capturing apparatus.
Figure 11:
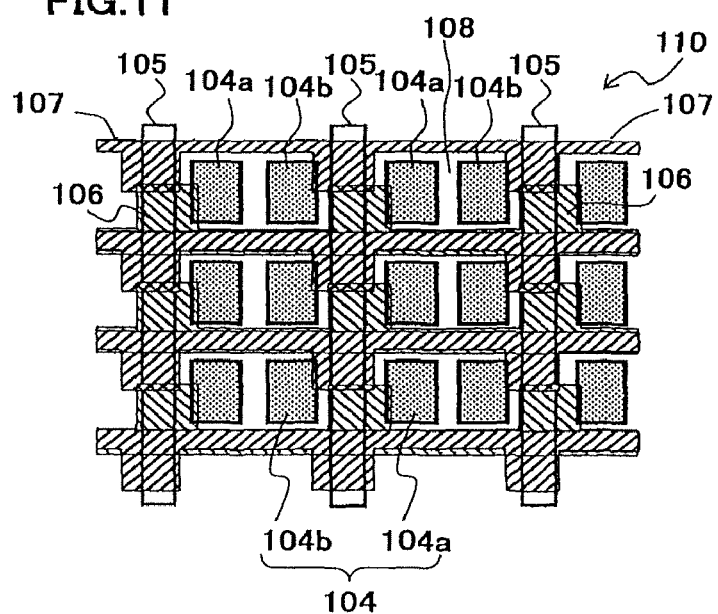
FIG. 11 is a top view showing an exemplary essential structure of an image capturing section of a conventional solid-state image capturing apparatus disclosed in Reference 1.
Figure 12:
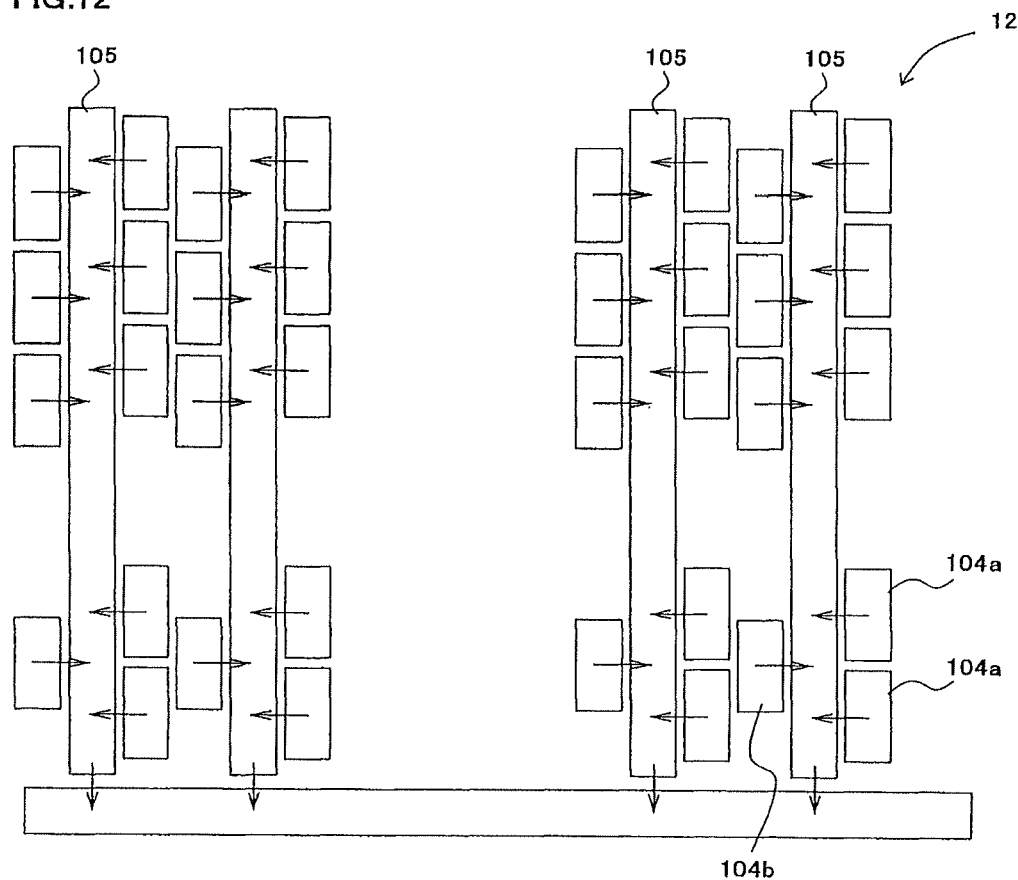
FIG. 12 is a top view schematically showing an exemplary essential structure of an image capturing section of a conventional solid-state image capturing apparatus disclosed in Reference 2.

Comparing with the matrix arrangement of the light receiving sections 104 in the conventional solid-state image capturing apparatus shown in FIG. 9, it is assumed in the embodiment of the present invention that the light receiving sections 4b arranged on the right side of the vertical charge transfer register 5 are shifted towards the upper side of the figure and arranged. Hereinafter, the description is focused on a driving pulse φV1 of the vertical transfer electrode 6 as well as a driving pulse φV2 of the vertical transfer electrode 7, which are shown in FIG. 1. The structures of a horizontal charge transfer and electric charge detection hereafter are the same as the ones for the horizontal charge transfer register 102 and the signal output section 103 in FIG. 9, and therefore, the structures of a horizontal charge transfer and electric charge detection will be described with reference to the horizontal charge transfer register 102 and the signal output section 103 in FIG. 9.

First, readout voltage Vh, or a driving pulse φV1, is applied to the vertical transfer electrode 6, and signal charges stored in the light receiving section 4a are read out to the vertical charge transfer register 5.

Next, the signal charges read out by the vertical charge transfer register 5 are transferred by one packet in a vertical direction by the vertical charge transfer register 5.

Then, readout voltage Vh, or a driving pulse φV2, is applied to the vertical transfer electrode 7, and the signal charges stored in the light receiving section 4b are read out to the vertical charge transfer register 5.

Figure 8:
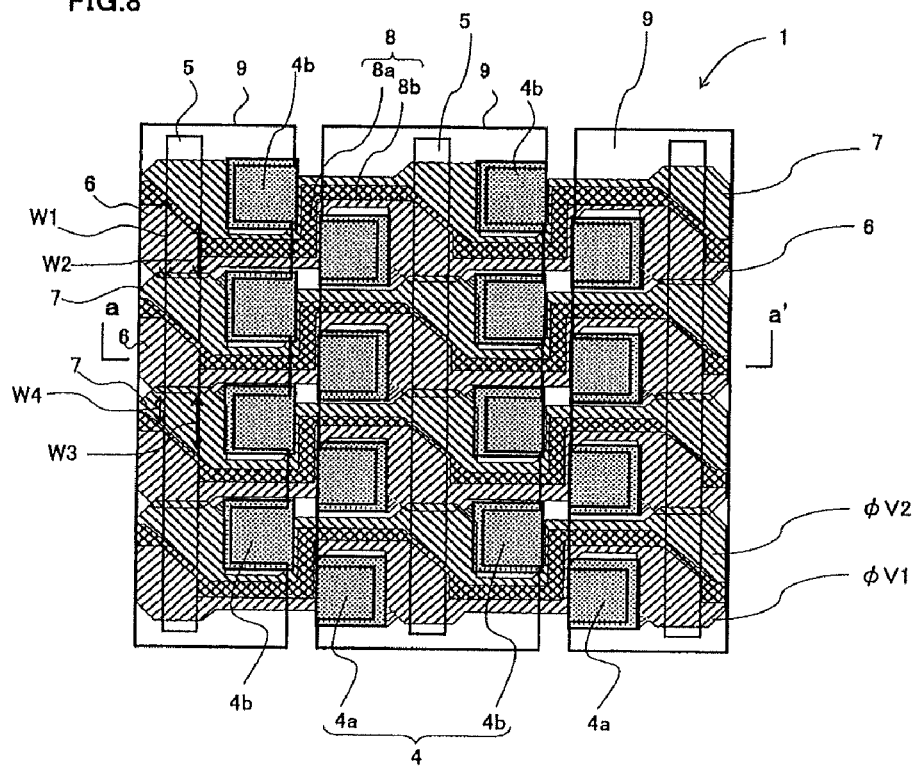
FIG. 8 is a top view showing still another exemplary essential structure of an image capturing section in the solid-state image capturing apparatus according to the embodiment of the present invention.

Further, the signal charges readout to the vertical charge transfer register 5 are transferred close to the horizontal charge transfer register 102 shown in FIG. 8, and the signal charges read out by the driving pulse φV1 to the vertical transfer electrode 6 are first transferred to the horizontal charge transfer register 102.

Next, the signal charges transferred to the horizontal charge transfer register 102 are transferred by one packet to a horizontal direction by the horizontal charge transfer register 102.

Then, the signal charges read out by the driving pulse φV2 to the vertical transfer electrode 7 are transferred to the horizontal charge transfer register 102.

Further, the signal charges are transferred in a horizontal direction up to the signal output section 103 and are detected by the signal output section 103. As a result, the signal charge level is detected in the same output order as that of the conventional solid-state image capturing apparatus, and it is feasible to perform the same signal processing as the conventional signal processing.

As described above, according to the solid-state image capturing apparatus of the embodiment of the present invention, the light receiving sections 4 are arranged on both of the left and right sides of the vertical charge transfer register 5. As a result, it is feasible to minimize the plane view area of the vertical charge transfer register 5 without increasing the readout voltage and to increase the area of the light receiving section 4. Thereby, it is feasible to prevent light receiving sensitivity from decreasing and to minimize the cell size. In addition, the light receiving sections 4 arranged on both the left and right sides of the vertical charge transfer register 5 are shifted from each other in a vertical direction and arranged. The first layer of the vertical transfer electrode 6 also serves as a readout electrode from the light receiving section arranged on one side of the vertical charge transfer register 5, and the second layer of the vertical transfer electrode 7 also serves as a readout electrode from a light receiving section arranged on the other side of the vertical charge transfer register 5. On vertical charge transfer register 5, the respective widths in a plane view (overlapping area) of the vertical transfer electrodes 6 and 7 are smoothly extended as the width of the vertical transfer electrodes 6 and 7 become closer to the light receiving section 4 side, where signal charges are read out, and the vertical transfer electrodes 6 and 7 are formed longer on one side of the vertical charge transfer register 5 in a vertical direction than the opposite side. Therefore, it is feasible to arrange the readout electrodes 6 and 7 widely on the readout portion of the light receiving sections 4 and to prevent the readout voltage from increasing. As a result, the width where the light receiving section 4 and the readout electrode come in contact with each other becomes larger (longer) than the conventional case, and therefore, the light receiving sensitivity and the dynamic range are prevented from decreasing without increasing the readout voltage and the cell size is minimized.

Although not specifically explained in the embodiment described above, according to the solid-state image capturing apparatus having, on a semiconductor substrate, a plurality of light receiving sections 4 for performing photoelectric conversion on incident light to generate a signal charge, a vertical charge transfer register 5 provided along each of the light receiving sections 4 arranged in a column direction among the plurality of light receiving sections 4, for transferring signal charges generated in the light receiving sections 4 in a predetermined vertical direction, and at least two layers of vertical transfer electrodes 6 and 7 provided on the vertical charge transfer register 5 via an insulation film, in which the light receiving sections 4 are arranged on both of the left and right sides of the vertical charge transfer register 5, the plane view width readable from the light receiving section 4 is in the range of 70% to the whole edge of the edge of the light receiving section 4 on the vertical charge transfer register 5 side. As a result, the width where the light receiving section 4 and the readout electrode come in contact with each other becomes wider (longer) than the conventional case, and therefore, the objective of the present invention, which is to prevent the light receiving sensitivity and the dynamic range from decreasing without increasing the readout voltage and to minimize the cell size, can be achieved.

Similarly, although not specifically explained in the embodiment described above, according to the solid-state image capturing apparatus having, on a semiconductor substrate, a plurality of light receiving sections 4 for performing photoelectric conversion on incident light to generate a signal charge, a vertical charge transfer register 5 provided along each of the light receiving sections 4 arranged in a column direction among the plurality of light receiving sections 4, for transferring signal charges generated in the light receiving sections 4 in a predetermined vertical direction, and at least two layers of vertical transfer electrodes 6 and 7 provided on the vertical charge transfer register 5 via an insulation film, in which the light receiving sections 4 are arranged on both of the left and right sides of the vertical charge transfer register 5, the crossing lengths in a vertical direction on the left end and the right end of the vertical transfer electrodes 6 and 7 overlapping the vertical charge transfer register 5 are different so that the plane view width of the light receiving section 4 capable of reading out signal charges from the light receiving section 4 to the vertical charge transfer register 5 becomes wider. More specifically, the crossing length of the vertical transfer electrode 6 and the left end of the vertical charge transfer register 5 in a plane view is different from the crossing length of the vertical transfer electrode 7 and the left end of the vertical charge transfer register 5 in a plane view. In addition, the crossing length of the vertical transfer electrode 6 and the right end of the vertical charge transfer register 5 in a plane view is different from the crossing length of the vertical transfer electrode 7 and the right end of the vertical charge transfer register 5 in a plane view. Further, the crossing length of the vertical transfer electrode 6 and the left end of the vertical charge transfer register 5 in a plane view is different from the crossing length of the vertical transfer electrode 6 and the right end of the vertical charge transfer register 5 in a plane view. The crossing length of the vertical transfer electrode 7 and the left end of the vertical charge transfer register 5 in a plane view is different from the crossing length of the vertical transfer electrode 7 and the right end of the vertical charge transfer register 5 in a plane view. Using such a structure, the width where the light receiving section 4 and the readout electrode come in contact with each other becomes wider (longer) than the conventional case, and therefore, the objective of the present invention, which is to prevent the light receiving sensitivity and the dynamic range from decreasing without increasing the readout voltage and to minimize the cell size, can be achieved.

Figure 3:
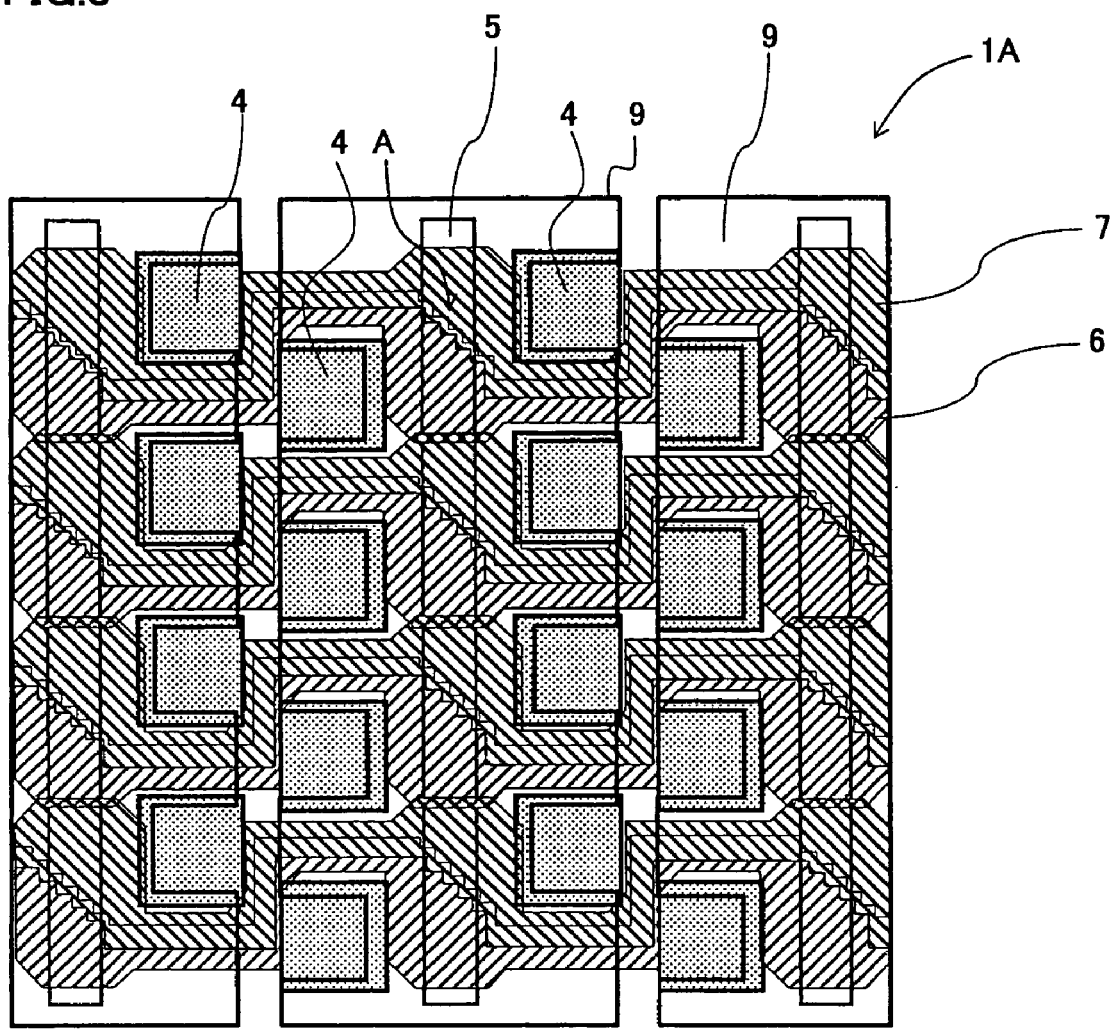
FIG. 3 is a top view showing another exemplary essential structure of an image capturing section in the solid-state image capturing apparatus according to the embodiment of the present invention.

According to the embodiment of the present invention, as an image capturing section 1 of the solid-state image capturing apparatus, the overlapping region of the vertical transfer electrodes 6 and 7 on the vertical charge transfer register 5 (overlapping area of the vertical charge transfer register 5 and the vertical transfer electrodes 6 and 7) is smoothly extended in a vertical direction as the width of the vertical transfer electrodes 6 and 7 become closer to the side of the light receiving section 4, from which signal charges are read out. However, as an image capturing section 1A of the solid-state image capturing apparatus shown in FIG. 3, the vertical transfer electrodes 6 and 7 may be extended stepwise (step-like; stepwise portion A) instead of smooth transition. Further, according to the embodiment of the present invention, the overlapping region of the vertical transfer electrodes 6 and 7 on the vertical charge transfer register 5 (overlapping area of the vertical charge transfer register 5 and the vertical transfer electrodes 6 and 7) is smoothly narrowed towards the opposite side from the side of the light receiving section, from which signal charges are readout. However, as an image capturing section 1A of the solid-state image capturing apparatus as shown in FIG. 3, the vertical transfer electrodes 6 and 7 may be narrowed stepwise (step-like; stepwise portion A) instead of smooth transition.

Figure 4:
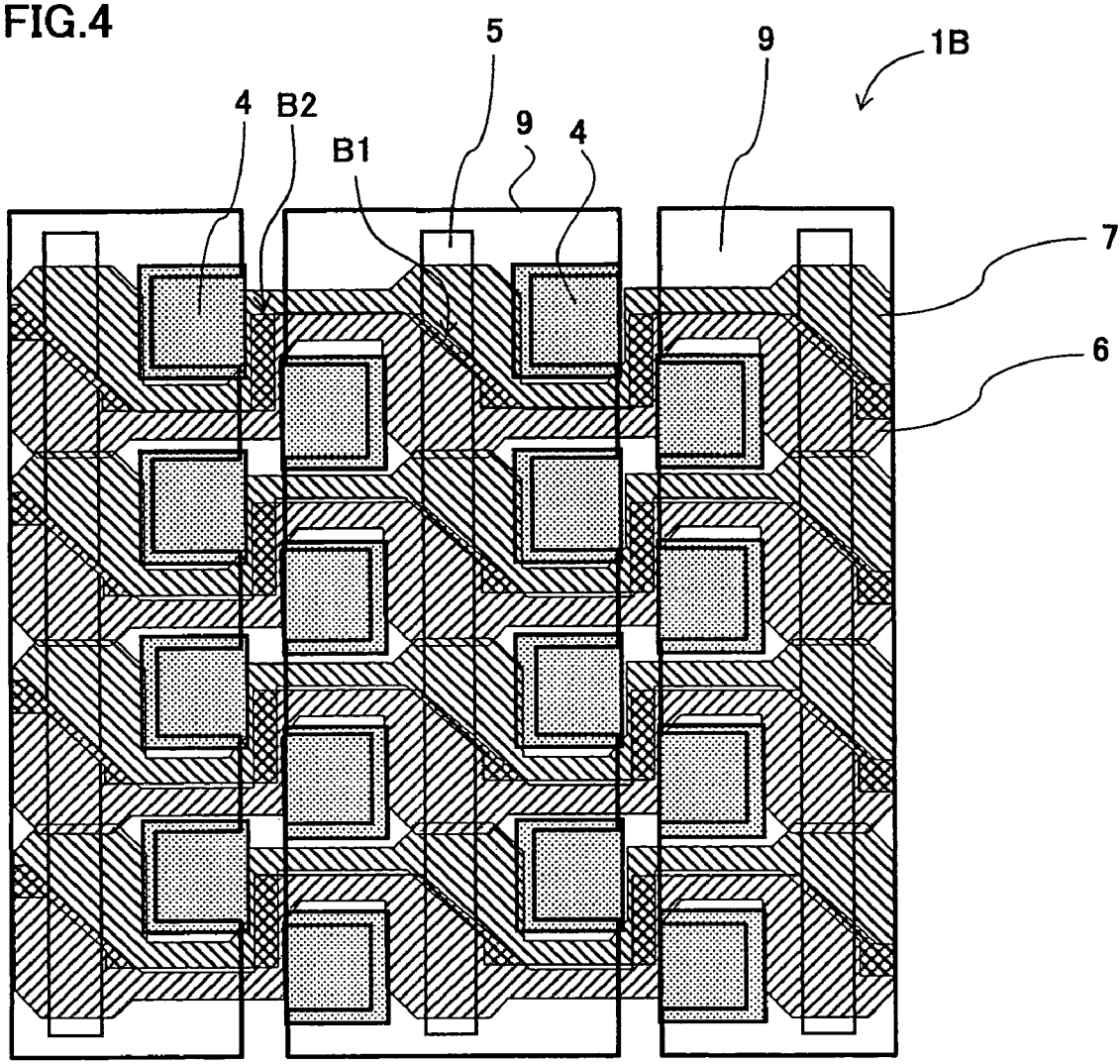
FIG. 4 is a top view showing still another exemplary essential structure of an image capturing section in the solid-state image capturing apparatus according to the embodiment of the present invention.
Figure 5:
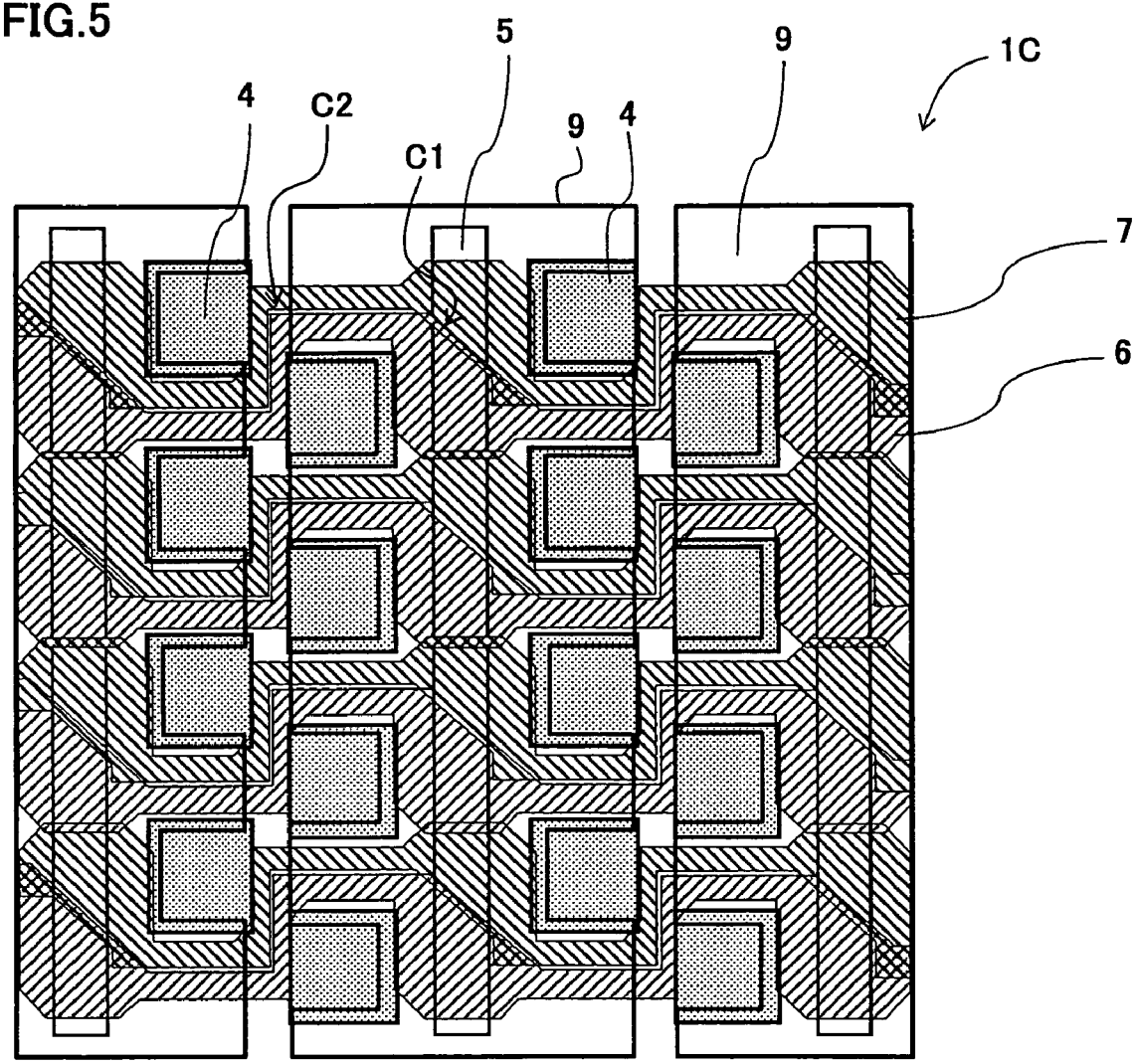
FIG. 5 is a top view showing still another exemplary essential structure of an image capturing section in the solid-state image capturing apparatus according to the embodiment of the present invention.

Further, according to the embodiment of the present invention, as an image capturing section 1 of the solid-state image capturing apparatus, the second layer of the vertical transfer electrode 7 is formed in an overlapping manner on the first layer of the vertical transfer electrode 6 in the separation area 8. However, as shown in FIG. 4, the vertical transfer electrode 6 and the vertical transfer electrode 7 have only to overlap with the vertical charge transfer register 5 at an overlapping portion B1. In addition, as an image capturing section 1B of the solid-state image capturing apparatus, other than overlapping on the vertical charge transfer register 5, the first layer of the vertical transfer electrode 6 and the second layer of the vertical transfer electrode 7 may overlap partially on an overlapping portion B2 on the separation area 8. Further, as shown in FIG. 5, the vertical transfer electrode 6 and the vertical transfer electrode 7 have only to overlap partially at an overlapping portion C1 on the vertical charge transfer register 5. As an image capturing section 1C of the solid-state image capturing apparatus, other than overlapping the vertical charge transfer register 5, the first layer of the vertical transfer electrode 6 and the second layer of the vertical transfer electrode 7 may not be overlapping each other at all as can be seen as an adjacent portion C2 between the first layer of the vertical transfer electrode 6 and the second layer of the vertical transfer electrode 7 on the separation area 8.

Figure 6:
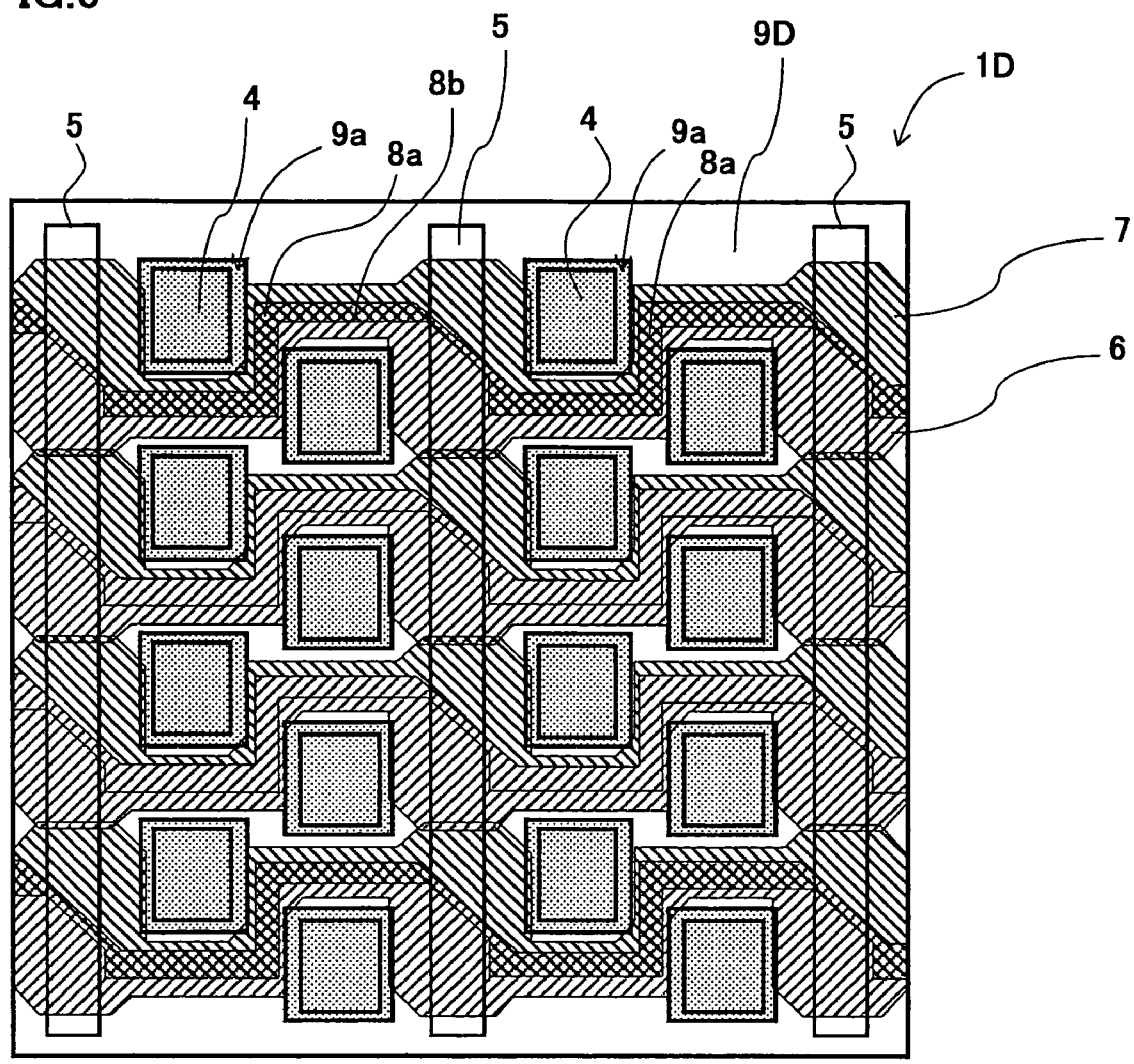
FIG. 6 is a top view showing still another exemplary essential structure of an image capturing section in the solid-state image capturing apparatus according to the embodiment of the present invention.
Figure 7:
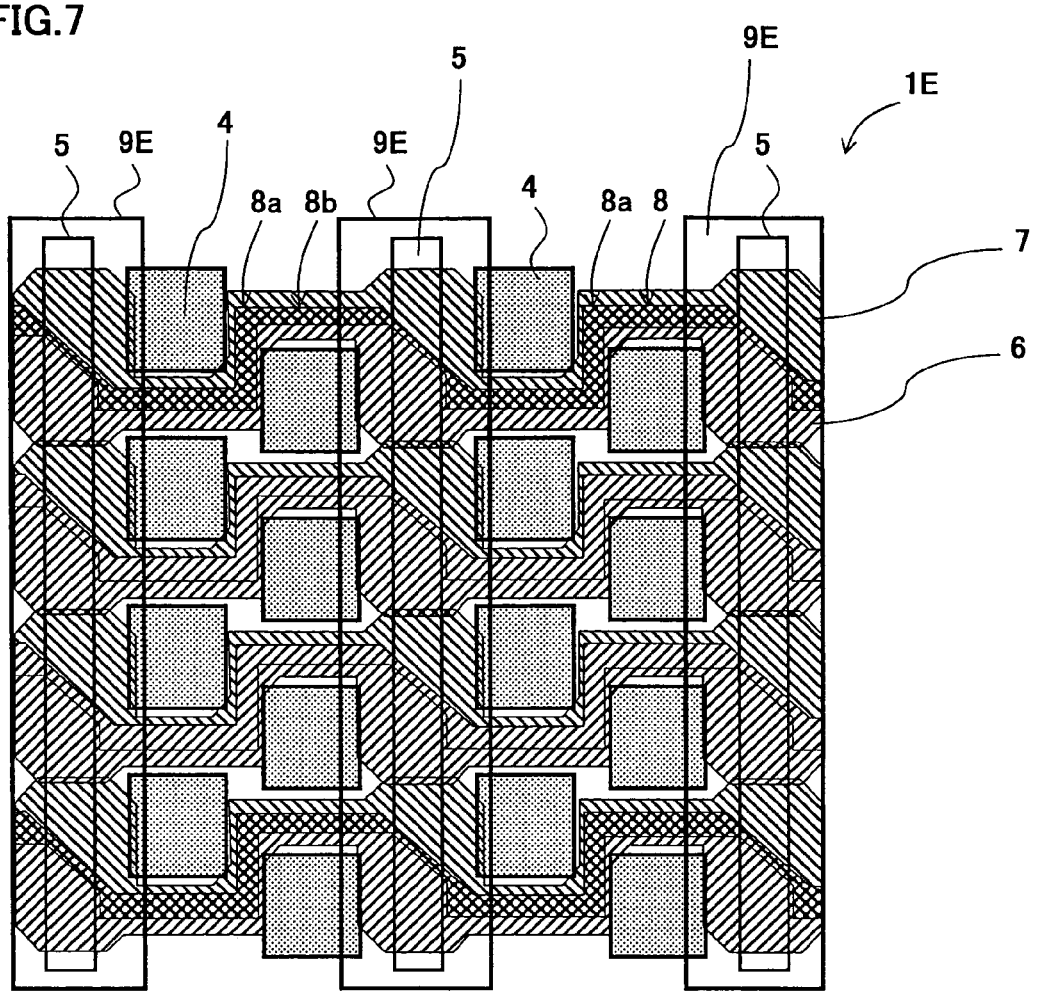
FIG. 7 is a top view showing still another exemplary essential structure of an image capturing section in the solid-state image capturing apparatus according to the embodiment of the present invention.

Further, in the embodiment described above, a case has been described where, as an image capturing section 1 of the solid-state image capturing apparatus, a shading film 9 is not arranged on the horizontal separation area 8a in the separation area 8 for separating the light receiving sections 4. However, as shown in FIG. 6, as an image capturing section 1D of the solid-state image capturing apparatus, the whole image capturing section may be covered by a shading film 9D except for an opening 9a above the light receiving sections 4. This structure is effective for controlling a mixture of colors since there is a case where incident light going into the horizontal separation area 8a may cause a mixture of colors. In addition, as shown in FIG. 7, as an image capturing section 1E of the solid-state image capturing apparatus, a shading film 9E does not have to be provided on either the horizontal separation area 8a or the vertical separation area 8b. According to this structure, a shading film 9E only covers around the vertical charge transfer register 5, and the opening above the light receiving sections 4 are wider compared with the structure of the embodiment described above. Therefore, the light receiving sensitivity can be improved.

More specifically, the shading film 9 is provided to cover at least the vertical transfer electrodes 6 and 7 with the opening 9a provided above the light receiving section 4. With regard to the separation area 8, the shading film 9 is provided in such a manner to open above the horizontal separation area 8a that separates the plurality of light receiving sections 4 in a horizontal direction, or the shading film 9D covers the whole image capturing section 1 except for the area above the light receiving sections 4, or the shading film 9E is provided in such a manner to open above the horizontal separation area 8a and above the vertical separation area 8b that separates the plurality of light receiving sections 4 in a vertical direction.

A case has been described in the embodiment described above where, in FIG. 1, the plane view width readable from one side of the light receiving section 4, which is square or rectangular in a plane view, (the width where the light receiving section 4 and the readout electrode come in contact with each other) is about 75% of an edge of the light receiving section 4 on the vertical charge transfer register 5 side (which is a ratio larger than the conventional approximately 50% (or less than 50%)) in order to prevent the readout voltage from increasing. However, the increase in the readout voltage can be further prevented if the plane view width (the width where the light receiving section 4 and the readout electrode come in contact with each other) is as long as the whole edge (about 100%) of the light receiving section 4 on the vertical charge transfer register 5 side. This structure is shown in FIG. 8. In short, the plane view width readable from the light receiving section 4 is 50% (50% of the length of the edge) to the whole edge (50% or more to 100% or less, or more than 50% to 100% or less) of the edge of the light receiving section 4 on the vertical charge transfer register 5 side. More preferably, the plane view width, width in which the light receiving section 4 and the readout electrode come in contact with each other, is 60% (60% of the length of the edge) to the whole edge of the edge of the light receiving section 4 on the vertical charge transfer register 5 side, or the plane view width is 70% (70% of the length of the edge) to the whole edge of the edge of the light receiving section 4 on the vertical charge transfer register 5 side. The best plane view width, in which the light receiving section 4 and the readout electrode come in contact with each other, is the whole length (100% of the length of the edge) of the light receiving section 4 of the vertical charge transfer register 5 side.

A case has been described in the embodiment described above where the two layers of vertical transfer electrode 6 and vertical transfer electrode 7 are provided via an insulation film on the vertical charge transfer register 5, which functions as a charge transfer section. However, the vertical transfer electrodes can have three layers or four layers and the vertical transfer electrodes can still be formed similarly as the case with the two layers described above. In short, the present invention has only to have at least two layers of the vertical transfer electrodes 6 and 7 provided via an insulation film on the vertical charge transfer register 5.

Although not explained in the embodiment described above, an electronic information device will be described hereinafter. The electronic information device, such as a digital camera (e.g., digital video camera and digital still camera), an image input camera (e.g., monitoring camera, a door intercom camera, a car-mounted camera, a camera for television telephone and a camera for cell phone), a scanner, a facsimile machine and a camera-equipped cell phone device, has an image capturing section using the solid-state image capturing apparatus according to the embodiment of the present invention described above as an image input device.

Figure 13:
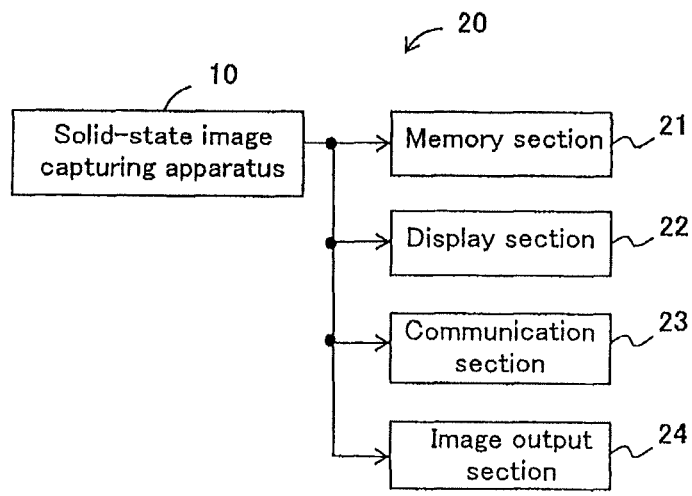
FIG. 13 is a block diagram showing an exemplary diagrammatic structure of an electronic information device including the solid-state image capturing apparatus according to the embodiment of the present invention in an image capturing section.

FIG. 13 is a block diagram showing an exemplary diagrammatic structure of an electronic information device including the solid-state image capturing apparatus according to the embodiment of the present invention in an image capturing section.

In FIG. 13, the electronic information device 20 according to the present invention includes a solid-state image capturing apparatus 10 according to the embodiment of the present invention in an image capturing section so that high-quality image data can be obtained. Further, the electronic information device 20 includes: a memory section 21 (e.g., recording media) for data-recording a high-quality image data obtained by the solid-state image capturing apparatus 10 after a predetermined signal process is performed on the image data for recording; a display section 22 (e.g., liquid crystal display device) for displaying this image data from the solid-state image capturing apparatus 10 on a display screen (e.g., liquid crystal display screen) after a predetermined signal process is performed for display; a communication section 23 (e.g., transmitting and receiving device) for communicating this image data from the solid-state image capturing apparatus 10 after a predetermined signal process is performed on the image data for communication; and an image output section 24 for printing (typing out) and outputting (printing out) this image data from the solid-state image capturing apparatus 10. Further, the electronic information device 20 may also include at least any of: the memory section 21, the display section 22, the communication section 23, and the image output section 24 (e.g., a printer), other than the solid-state image capturing apparatus 10.

Therefore, based on color image signals from the solid-state image capturing apparatus 10, the electronic information device 20 of the present invention is capable of displaying the color image signals on a display screen finely, printing out (outputting) the color image signals finely by an image output apparatus 24, communicating the color image signals finely as communication data via wire or radio, storing the color image signals finely by performing a predetermined data compression process on the memory section 21, and performing various data processes finely.

As described above, the present invention is exemplified by the use of the embodiment. However, the present invention should not be interpreted solely based on the embodiment described above. It is understood that the scope of the present invention should be interpreted solely based on the claims. It is also understood that those skilled in the art can implement equivalent scope of technology, based on the description of the present invention and common knowledge from the description of the detailed preferred embodiment of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in a field of a solid-state image capturing apparatus having semiconductor devices for performing photoelectric conversion on image light reflected from a subject to capture the image of the subject, and more particularly, to a solid-state image capturing apparatus suitable for minimizing a cell size, and an electronic information device, such as a digital camera (e.g., digital video camera and digital still camera), an image input camera, a scanner, a facsimile machine and a camera-equipped cell phone device, having the solid-state image capturing apparatus as an image input device in an image capturing section of the electronic information device.

According to the solid-state image capturing apparatus, in which the light receiving sections are arranged on both of the left and right sides of the vertical charge transfer registers functioning as a charge transfer section and, for example, the positions of the light receiving sections are shifted from each other in a vertical direction and arranged, the area (overlapping portion) of the charge transfer electrode (vertical transfer electrode) on the vertical charge transfer register is extended as the area of the charge transfer electrode on the vertical charge transfer register becomes closer to the light receiving section side, so that the readout electrode is arrangeable on the whole readout portion of the light receiving section. As a result, it is feasible to minimize the area of the vertical charge transfer register without increasing the readout voltage and to increase the area of the light receiving section. Thereby, it is feasible to manufacture the solid-state image capturing apparatus whose light receiving sensitivity and the dynamic range are prevented from decreasing without increasing the readout voltage and whose cell size is minimized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing apparatus having, on a semiconductor substrate, a plurality of light receiving sections for performing photoelectric conversion on incident light to generate a signal charge, a charge transfer section provided along a light receiving section arranged in a column direction among the plurality of light receiving sections, for transferring signal charges generated in the light receiving section arranged in the column direction to a predetermined direction, and at least two layers of charge transfer electrodes provided on the charge transfer section via an insulation film, in which the light receiving sections are respectively arranged on both of the left and right sides of the charge transfer section,
wherein a plane view width readable from the light receiving section is 50% to the whole edge of the edge of the light receiving section on the charge transfer section side.

2. A solid-state image capturing apparatus according to claim 1, wherein the plane view width readable from the light receiving section is a crossing length of the light receiving section and the readout electrode and is 50% to the whole edge of the edge of the light receiving section on the charge transfer section side.

3. A solid-state image capturing apparatus according to claim 1, wherein the light receiving section on one side of the charge transfer section and the light receiving section on the other side are shifted from each other along the predetermined direction and arranged.

4. A solid-state image capturing apparatus according to claim 1, wherein a first layer of the charge transfer electrode also serves as a readout electrode to read out signal charges from the light receiving section arranged on one side of the charge transfer section to the charge transfer section, and a second layer of the charge transfer electrode also serves as a readout electrode to read out signal charges from the light receiving section arranged on the other side of the charge transfer section to the charge transfer section.

5. A solid-state image capturing apparatus according to claim 1, wherein, in the left end and the right end above the charge transfer section, the crossing length of the charge transfer electrode on the light receiving section side, from which signal charges are read out, is formed longer in the predetermined direction than the crossing length on the opposite side.

6. A solid-state image capturing apparatus according to claim 5, wherein the crossing length becomes smoothly longer or becomes longer stepwise from one end to another end between the left end and the right end of the charge transfer section.

7. A solid-state image capturing apparatus according to claim 1, wherein, in the left end and the right end above the charge transfer section, the crossing length of the charge transfer electrode on the opposite side from the light receiving section side, from which signal charges are read out, is formed shorter in the predetermined direction than the crossing length on the light receiving section side.

8. A solid-state image capturing apparatus according to claim 7, wherein the crossing length becomes smoothly shorter or becomes shorter stepwise from one end to another end between the left end and the right end of the charge transfer section.

9. A solid-state image capturing apparatus according to claim 1, wherein, on the charge transfer section, an overlapping area of the charge transfer electrode is either smoothly extended or is extended stepwise in a plane view as the area becomes closer to the side of the light receiving section, from which signal charges are read out.

10. A solid-state image capturing apparatus according to claim 1, wherein, on the charge transfer section, an overlapping area of the charge transfer electrode is either smoothly narrowed or is narrowed stepwise in a plane view as the area becomes closer to the opposite side of the side of the light receiving section, from which signal charges are read out.

11. A solid-state image capturing apparatus according to claim 1, wherein the second layer of the charge transfer electrode and the first layer of the charge transfer electrode are partially overlapping on the charge transfer section.

12. A solid-state image capturing apparatus according to claim 1, wherein a separation area for separating the plurality of light receiving sections is further provided between adjacent light receiving sections.

13. A solid-state image capturing apparatus according to claim 12, wherein the second layer of the charge transfer electrode and the first layer of the charge transfer electrode are either partially overlapping with each other or not overlapping at all with each other on at least a part of the separation area.

14. A solid-state image capturing apparatus according to claim 12, wherein boron is implanted into the separation area with impurity concentration of the range of $1 \times 10^{16}$ cm$^{-3}$ to $1 \times 10^{17}$ cm$^{-3}$.

15. A solid-state image capturing apparatus according to claim 1, wherein a shading film is provided so that at least the charge transfer electrode is covered, with an opening provided above the light receiving section.

16. A solid-state image capturing apparatus according to claim 15, wherein a separation area is further provided to separate the plurality of light receiving section, and with regard to the separation area, a shading film is provided in such a manner to open above a horizontal separation area that separates the plurality of light receiving sections in a horizontal direction, or a shading film covers the whole image capturing section except for the opening above the light receiving sections, or a shading film is provided in such a manner to open above a horizontal separation area and above a vertical separation area that separates the plurality of light receiving sections in a vertical direction.

17. A solid-state image capturing apparatus according to claim 1, wherein the charge transfer section is formed of a vertical charge transfer register.

18. A solid-state image capturing apparatus according to claim 17, further including a horizontal charge transfer register for transferring a signal charge of each pixel row in a horizontal direction, the signal charge of each pixel row being transferred in a vertical direction by the vertical charge transfer register, and a signal output section for successively detecting the signal charge transferred by the horizontal charge transfer register to output the signal charge as an image capturing signal.

19. A solid-state image capturing apparatus according to claim 1, wherein the light receiving section is a square or a rectangle in a plane view.

20. An electric information device including the solid-state image capturing device according to claim 1 as an image input device in an image capturing section.

21. A solid-state image capturing apparatus having, on a semiconductor substrate, a plurality of light receiving sections for performing photoelectric conversion on incident light to generate a signal charge, a charge transfer section provided along a light receiving section arranged in a column direction among the plurality of light receiving sections, for transferring signal charges generated in the light receiving section arranged in the column direction to a predetermined direction, and at least two layers of charge transfer electrodes provided on the charge transfer section via an insulation film, in which the light receiving sections are respectively arranged on both of the left and right sides of the charge transfer section,
    wherein a length of the charge transfer electrode in the predetermined direction is different at a location above the left edge of the charge transfer section than at a location above the right edge of the charge transfer section.

22. A solid-state image capturing apparatus according to claim 21, wherein the light receiving section on one side of the charge transfer section and the light receiving section on the other side are shifted from each other along the predetermined direction and arranged.

23. A solid-state image capturing apparatus according to claim 21, wherein a first layer of the charge transfer electrode also serves as a readout electrode to read out signal charges from the light receiving section arranged on one side of the charge transfer section to the charge transfer section, and a second layer of the charge transfer electrode also serves as a readout electrode to read out signal charges from the light receiving section arranged on the other side of the charge transfer section to the charge transfer section.

24. A solid-state image capturing apparatus according to claim 21, wherein, in the left end and the right end above the charge transfer section, the crossing length of the charge transfer electrode on the light receiving section side, from which signal charges are read out, is formed longer in the predetermined direction than the crossing length on the opposite side.

25. A solid-state image capturing apparatus according to claim 24, wherein the crossing length becomes smoothly longer or becomes longer stepwise from one end to another end between the left end and the right end of the charge transfer section.

26. A solid-state image capturing apparatus according to claim 21, wherein, in the left end and the right end above the charge transfer section, the crossing length of the charge transfer electrode on the opposite side from the light receiving section side, from which signal charges are read out, is formed shorter in the predetermined direction than the crossing length on the light receiving section side.

27. A solid-state image capturing apparatus according to claim 26, wherein the crossing length becomes smoothly shorter or becomes shorter stepwise from one end to another end between the left end and the right end of the charge transfer section.

28. A solid-state image capturing apparatus according to claim 21, wherein, on the charge transfer section, an overlapping area of the charge transfer electrode is either smoothly extended or is extended stepwise in a plane view as the area becomes closer to the side of the light receiving section, from which signal charges are read out.

29. A solid-state image capturing apparatus according to claim 21, wherein, on the charge transfer section, an overlapping area of the charge transfer electrode is either smoothly narrowed or is narrowed stepwise in a plane view as the area becomes closer to the opposite side of the side of the light receiving section, from which signal charges are read out.

30. A solid-state image capturing apparatus according to claim 21, wherein the second layer of the charge transfer electrode and the first layer of the charge transfer electrode are partially overlapping on the charge transfer section.

31. A solid-state image capturing apparatus according to claim 21, wherein a separation area for separating the plurality of light receiving sections is further provided between adjacent light receiving sections.

32. A solid-state image capturing apparatus according to claim 31, wherein the second layer of the charge transfer electrode and the first layer of the charge transfer electrode are either partially overlapping with each other or not overlapping at all with each other on at least a part of the separation area.

33. A solid-state image capturing apparatus according to claim 31, wherein boron is implanted into the separation area with impurity concentration of the range of $1 \times 10^{16}$ cm$^{-3}$ to $1 \times 10^{17}$ cm$^{-3}$.

34. A solid-state image capturing apparatus according to claim 21, wherein a shading film is provided so that at least the charge transfer electrode is covered, with an opening provided above the light receiving section.

35. A solid-state image capturing apparatus according to claim 34, wherein a separation area is further provided to separate the plurality of light receiving section, and with regard to the separation area, a shading film is provided in such a manner to open above a horizontal separation area that separates the plurality of light receiving sections in a horizontal direction, or a shading film covers the whole image capturing section except for the opening above the light receiving sections, or a shading film is provided in such a manner to open above a horizontal separation area and above a vertical separation area that separates the plurality of light receiving sections in a vertical direction.

36. A solid-state image capturing apparatus according to claim 21, wherein the charge transfer section is formed of a vertical charge transfer register.

37. A solid-state image capturing apparatus according to claim 36, further including a horizontal charge transfer register for transferring a signal charge of each pixel row in a horizontal direction, the signal charge of each pixel row being transferred in a vertical direction by the vertical charge transfer register, and a signal output section for successively detecting the signal charge transferred by the horizontal charge transfer register to output the signal charge as an image capturing signal.

38. A solid-state image capturing apparatus according to claim 21, wherein the light receiving section is a square or a rectangle in a plane view.

39. An electric information device including the solid-state image capturing device according to claim 21 as an image input device in an image capturing section.

* * * * *